US006832325B2

(12) United States Patent
Liu

(10) Patent No.: US 6,832,325 B2
(45) Date of Patent: Dec. 14, 2004

(54) DEVICE ON A SOURCE SYNCHRONOUS BUS SENDING DATA IN QUADRATURE PHASE RELATIONSHIP AND RECEIVING DATA IN PHASE WITH THE BUS CLOCK SIGNAL

(75) Inventor: Jonathan H. Liu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 573 days.

(21) Appl. No.: 09/749,899

(22) Filed: Dec. 29, 2000

(65) Prior Publication Data

US 2002/0087911 A1 Jul. 4, 2002

(51) Int. Cl.[7] .............................. H04L 7/00; G06F 1/04; G06F 13/00
(52) U.S. Cl. ..................... 713/400; 713/600; 710/100
(58) Field of Search ................................. 713/400, 600; 710/100, 107, 110, 305; 714/718, 731

(56) References Cited

U.S. PATENT DOCUMENTS

| | | | | |
|---|---|---|---|---|
| 5,432,823 A | * | 7/1995 | Gasbarro et al. | 375/356 |
| 5,614,855 A | * | 3/1997 | Lee et al. | 327/158 |
| 5,844,438 A | * | 12/1998 | Lee | 327/291 |
| 6,157,238 A | * | 12/2000 | Na et al. | 327/297 |
| 6,182,254 B1 | * | 1/2001 | Bae | 714/718 |
| 6,324,485 B1 | * | 11/2001 | Ellis | 702/117 |

FOREIGN PATENT DOCUMENTS

JP   10187275 A  *  7/1998  ............ G06F/1/12

OTHER PUBLICATIONS

Rambus, Inc., Direct Rambus Clock Generator Data Sheet, Document DL0056—Version 0.90, Mar. 1999, pp. 1–22.*
Tanaka et al, Front–End Readout System for PHENIX RICH, 1999 IEEE, pp. 346–352.*

* cited by examiner

Primary Examiner—Thomas Lee
Assistant Examiner—Suresh K Suryawanshi
(74) Attorney, Agent, or Firm—Schwegman, Lundberg, Woessner & Kluth, P.A.

(57) ABSTRACT

A device on a source synchronous data bus includes a clock generation circuit which generates transmit and receive clock signals for transmitting and receiving data. The device sends data in quadrature phase relationship with the bus clock signal and receives data in phase with the bus clock signal.

18 Claims, 3 Drawing Sheets

DEVICE ON A SOURCE SYNCHRONOUS BUS SENDING DATA IN QUADRATURE PHASE RELATIONSHIP AND RECEIVING DATA IN PHASE WITH THE BUS CLOCK SIGNAL

BACKGROUND

1. Field

Various embodiments may relate generally to data communication buses. In particular, the present invention relates to the data to clock phase relationship in a source synchronous bus.

2. Background

Synchronous data communication buses transfer data at a fixed phase relationship to the rising and falling edges of the bus clock as the data and bus clock travel together in the same flight time on the bus from source to destination. (In a source synchronous data bus, the bus clock is generated and provided by a device, such as an integrated circuit chip, on the bus.) Conventionally, the phase relationship is the same in both (frequently referred to as "read" and "write") directions. Typically, a master device sends out data to one or more slave devices in a quadrature phase relationship (at a fixed 90 degree offset) with the bus clock and the slave device(s) sends data to the master device in quadrature phase relationship with the bus clock.

In the case of memory buses or input/output (I/O) data buses, the master device is frequently a memory controller or a storage device controller and the slave device(s) are frequently memory devices or storage devices. Thus, data sent from the master device to the slave device(s) is frequently described as being sent in the "write" direction and the data sent from the slave device(s) to the master device is frequently described as being sent in the "read" direction. In the example of a Rambus memory subsystem, an clock chip at the end of the Rambus channel generates a ClockToMaster (CTM) clock signal, which passes through all the slave devices and goes into the master device. It then comes out of the master device as the ClockFromMaster (CFM) clock signal, again passes through all of the slave devices and is terminated at the end of the Rambus channel.

The slave device in conventional source synchronous buses relies upon a quadrature phase detector (QPD) in a delay locked loop (DLL) or phase locked loop (PLL) circuit to send out the data in quadrature phase relationship with the ClockToMaster bus clock. However, the poor performance and high power consumption of the QPD limits bus performance. These problems can become acute in buses with stringent clocking signal requirements, such as RDRAM buses (more commonly referred to as RDRAM channels). The distribution and spec allocation of the output centering of the RDRAM is larger than the master device. The major contributor of RDRAM to center error is the poor performance of the QPD.

DETAILED DESCRIPTION

An example embodiment of the invention is implemented on an RDRAM channel controlled by the memory controller integrated in the chipset of a computer. However, the example embodiment and the application of the example embodiment of the invention to the RDRAM channel as described in this application is merely exemplary. Various embodiments may be implemented according to the invention and these embodiments may of course be used in data communication buses other than RDRAM and need not be used on a data bus controlled by a memory controller integrated in the chipset of a computer. For example, some embodiments could be applied to Double Data Rate (DDR) Dynamic Random Access Memory (DRAM) buses, as well as data communication buses between high speed I/O products and very high speed communication chips.

Figure 1:
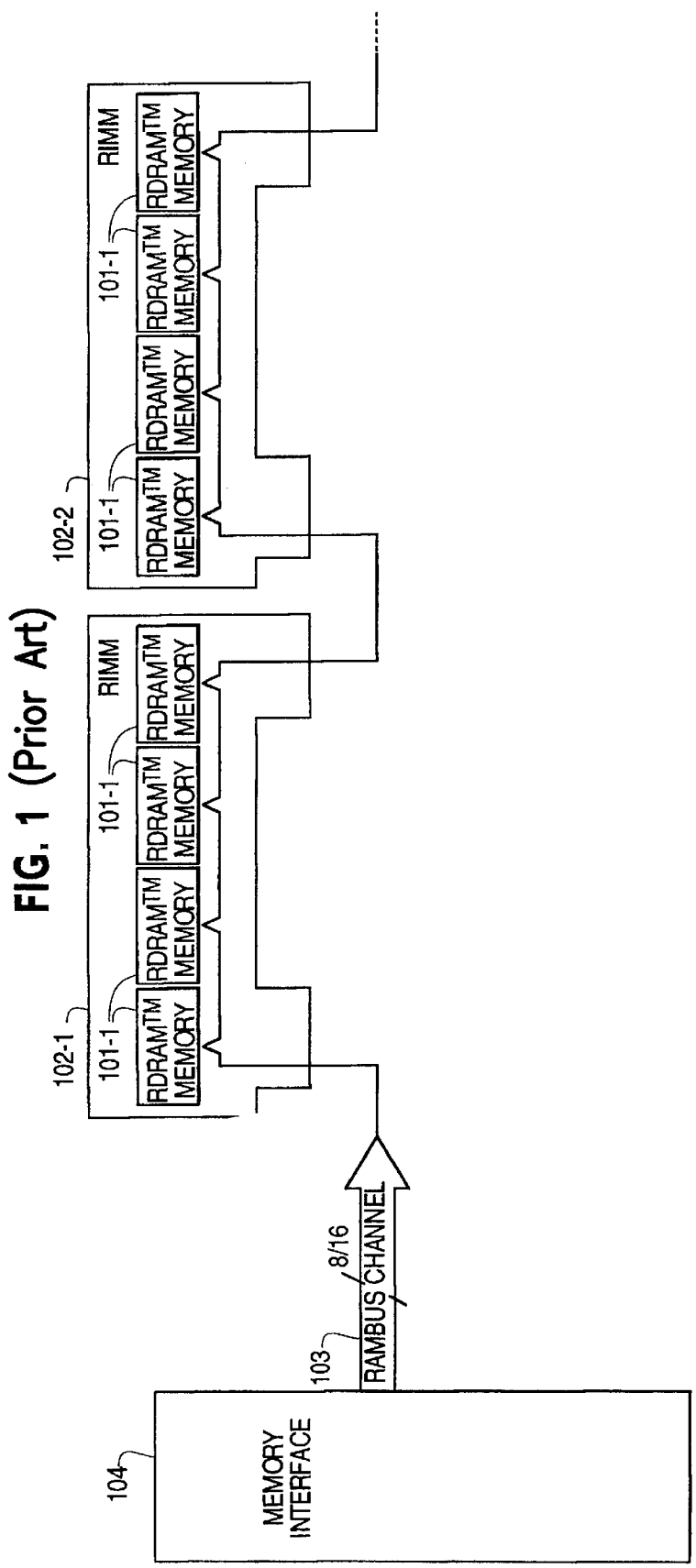
FIG. 1 is a generalized block diagram illustrating a conventional RDPAM™ bus (channel) connection between a memory interface and multiple RDRAM memory devices.

FIG. 1 illustrates a conventional installation of a RDRAM channel 103 between a memory interface 104 and a plurality of RDRAM™ memory devices 101-1. As shown, the RDRAM memory devices are mounted on a number of RIMM packaging units 102-1, 102-2, etc., which are electrically coupled in daisy chain fashion to memory interface 104 via Rambus channel 103.

RDRAM channel 103 is synchronous and includes 30 high-speed, controlled impedance, matched transmission lines. There are 18 data transmission lines, 8 address and control transmission lines, a ClockToMaster (CTM) line and its complement (CTM#), and ClockFromMaster (CFM) line and its complement (CTM#). Data is only transferred across the data transmission lines and all control information is sent across the address and control transmission lines.

RIMMs 102-1, etc. obviously differ from DIMMs insofar as they have RDRAM™ memories 101-1 rather than DRAM, but they also have two connectors instead of one so that they can be coupled in sequence in daisy chain fashion as shown in FIG. 1. The daisy chain arrangement of RIMMs 102-1, etc., provides electrical performance advantages. But it also results in more stringent clocking signal requirements to minimize skew in the clock to data phase relationship.

Clock and data travel in parallel to minimize skew. A RDRAM memory device 101-1 sends data to memory interface 104 synchronously with the ClockToMaster signal, and memory interface 104 sends data to RDRAM memory devices 101-1 synchronously with the ClockFromMaster signal. Because the transmission lines are matched, the clock and data signals remain synchronized as they are transmitted to their destination. The clock loop begins at the termination end of the RDRAM channel and propagates to memory interface 104 as ClockToMaster, where it loops back as ClockFromMaster to the RDRAM memory device 101-1 and terminates.

Figure 2:
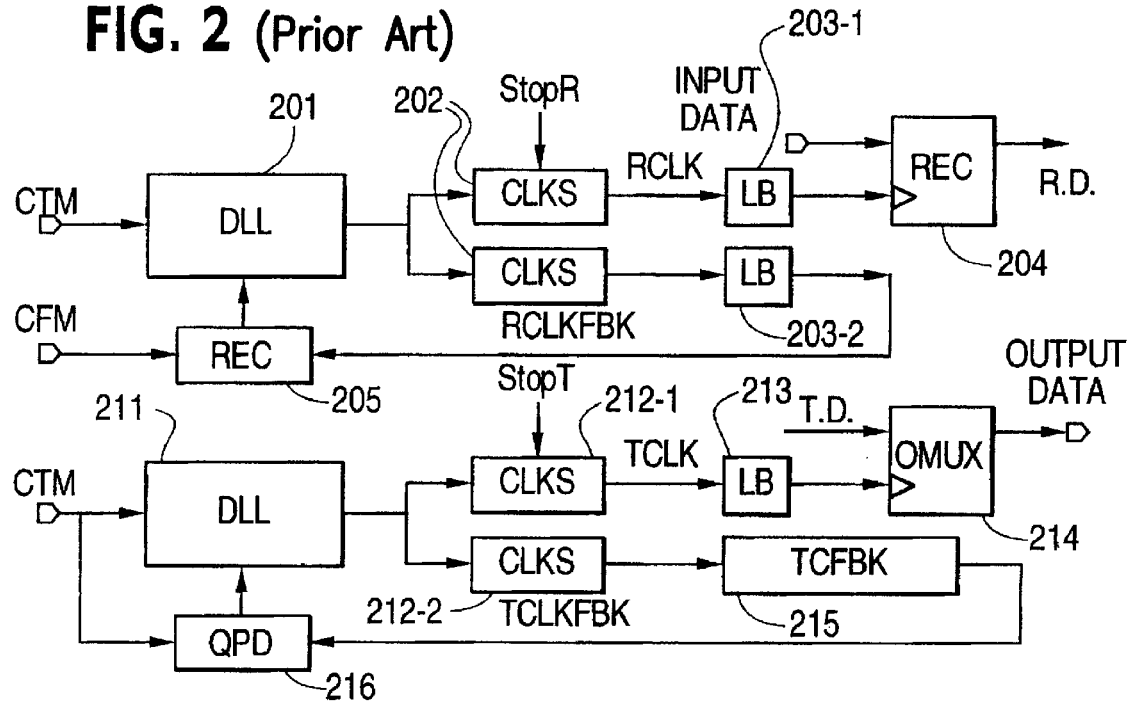
FIG. 2 is a block diagram illustrating a conventional slave clock generation circuit in a Rambus ASIC Cell.

Data is transferred on both the rising and falling edges, with each clock edge at the midpoint of the data valid period. FIG. 2 shows a conventional clock generation circuit in a Rambus ASIC Cell (RAC) which causes the transferred data to be centered at a 90 degree offset from the clock edges. On the receive side, a Delay Locked Loop (DLL) 201 receives the ClockToMaster signal and provides a signal to clocks 202. The receive clock signals from clocks 202 are provided to Local Buffers (LB) 203-1 and 203-2. The output of LB 203-1 clocks a receiver 204 receiving the input data and outputting the received data. The output of LB 203-2 is provided as a receive clock feedback signal (RCLKFBK) to receiver 205, which also receives the ClockFromMaster signal and provides a control signal to DLL 201.

On the transmit side, DLL 211 in FIG. 2 receives the ClockToMaster signal and provides a clock signal to clocks 212-1 and 212-2. The signal from clock 212-1 is buffered in Local Buffer (LB) 213 and then provided to the clock input of output multiplexer (OMUX) 214. OMUX 214 receives transmit data and then outputs a data signal according to the clocking signal from LB 213. The signal from clock 2122 is provided to a transmit clock feedback circuit (TCFBK) 215 which provides a transmit clock feedback signal to quadrature phase detector (QPD) 216. QPD 216 also receives the ClockToMaster signal and provides a control signal to DLL 211 to keep the data output from OMUX 214 centered at the edges of the CTM clock.

The poor performance and high power consumption of QPD 216 in the transmit clock generation circuit in FIG. 2 limits the performance of the data bus. The distribution and spec allocation of the output centering of the RDRAM is larger than the master device. In fact, the major contributor of the RDPAM tq center error is the poor performance of QPD 216 in the transmit clock generation circuit.

Figure 3:
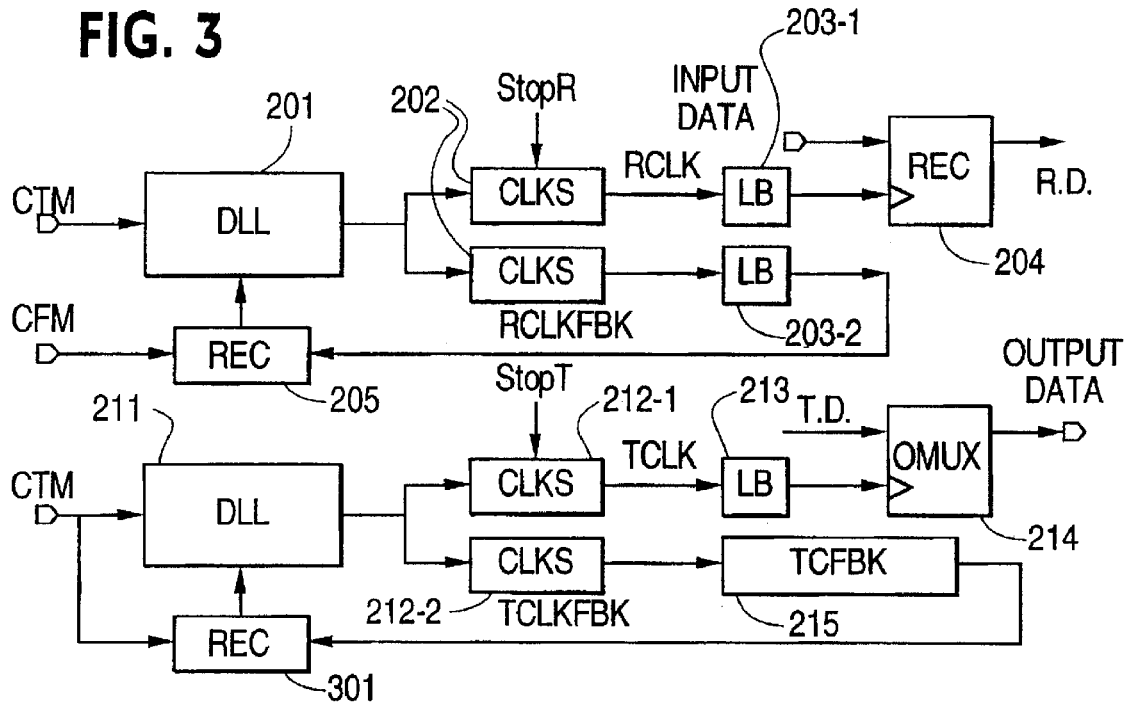
FIG. 3 is a block diagram illustrating an example embodiment of a slave clock generation circuit in a Rambus ASIC Cell according to some embodiments.

FIG. 3 shows a clock generation circuit according to some example embodiments of the invention. The circuit is similar in many respects to the circuit shown in FIG. 2 and common circuit elements have the same reference numbers. As is apparent, the example embodiment eliminates the quadrature phase detector in lieu of receiver 301 and thus does not have the disadvantages associated with the quadrature phase detector mentioned above.

The clock generation circuit of the example embodiment in FIG. 3 changes the fixed phase relationship between the data and clock phase. In the read direction, the slave devices send out data aligned and in phase with the clock edges, instead of a 90 degree phase offset. In the write direction, the master device can still send data in quadrature phase relationship. There is no collision on the RDPAM channel because there are a few clock cycles of idle time between read and write operations.

The example embodiment in FIG. 3 also permits an increase in the bus frequency and reduction of power consumption. It also simplifies the design, implementation and debugging when the clock generation is implemented in an integrated circuit chip, such as the memory controller hub of a chipset, since the transmit and receive circuit both use receivers instead of one circuit using a receiver and the other circuit using a quadrature phase detector.

Figure 4:
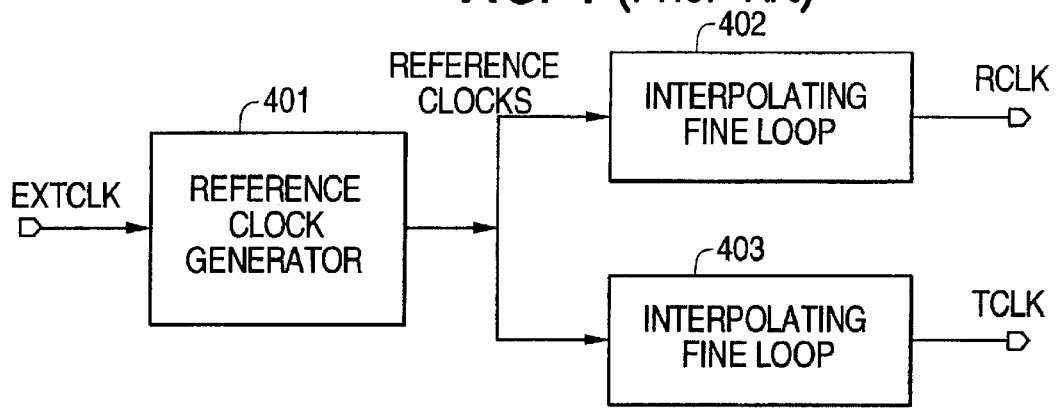
FIG. 4 shows the major components of conventional master and slave DLL circuits.

FIG. 4 shows the major components of conventional master and slave DLL circuits. Reference Clock Generator 401, which may be either integrated in a master or slave device or may be a separate clock generator, receives an external clock (EXTCLK) and outputs reference clocks. The conventional DLL circuit contains two interpolating fine loop components 402 and 403 which generate a corresponding receive clock (RCLK) and a corresponding transmit clock (TCLK).

Figure 5:
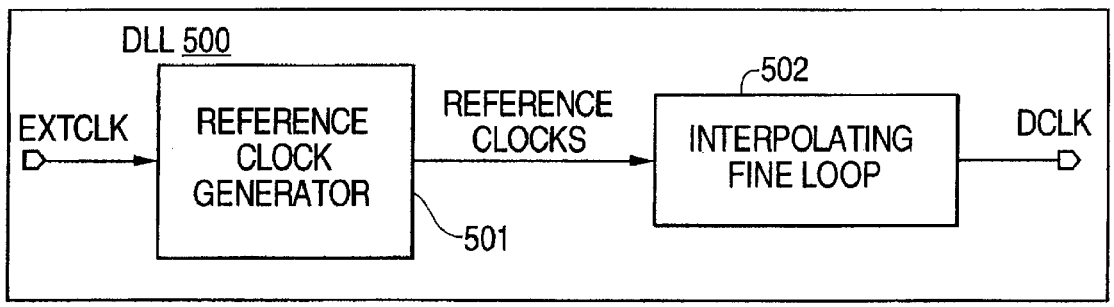
FIG. 5 shows the major components of a master DLL circuit in a ASIC Cell according to some example embodiments.

FIG. 5 shows the major components of a master DLL circuit in a Rambus ASIC Cell according to some example embodiments of the invention. Unlike the conventional circuit in FIG. 4, it contains only one interpolating fine loop component 502. Consequently, only one mixer and its digital circuitry is needed to produce data clock signal (DCLK).

Figure 6:
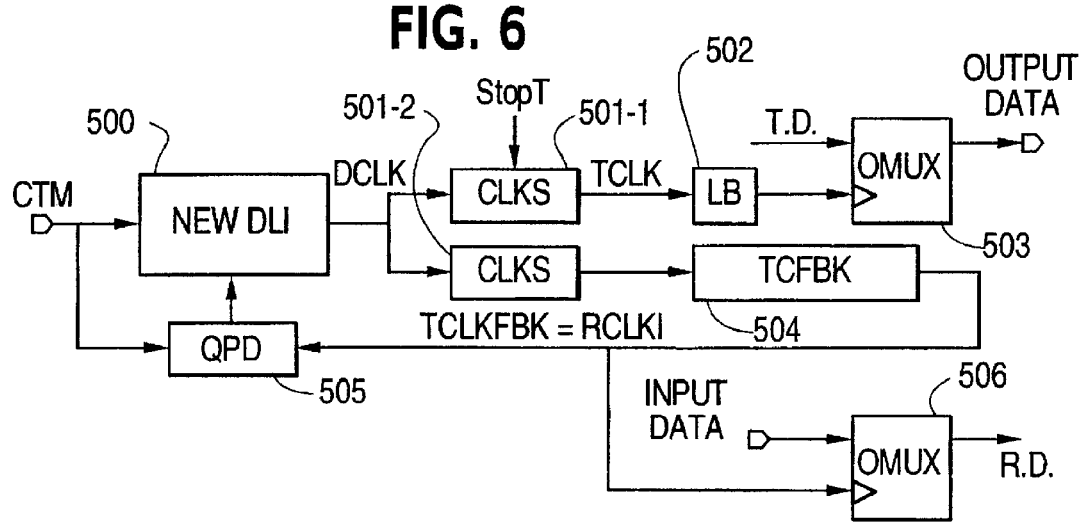
FIG. 6 shows an example embodiment of the master clock generation circuit in a Rambus ASIC Cell according to some embodiments.

FIG. 6 shows some example embodiments of the master clock generation circuit in a Rambus ASIC Cell which uses the DLL circuit shown in FIG. 5. DLL circuit 500 receives the ClockToMaster (CTM) signal and provides a single data clock sign (DCLK) to clocks 501-1 and 501-2. The clock signal (TCLK) from clock 501-1 is provide to and buffered in Local Buffers (LB) 502. The output of LB 502 is provided to the clock input of output multiplexer (OMUX) 503. OMUX 503 receives the transmit data and then outputs the transmit data according to the clocking signal from LB 502.

The clock signal from clock 501-2 is provided to a transmit clock feedback circuit (TCFBK) 504 which provides a transmit clock feedback signal (TCLKFBK=RCLKI) to quadrature phase detector (QPD) 505. QPD 505 also receives the ClockToMaster signal and provides a control signal to DLL 500. The transmit clock feedback signal (TCLKFBK=RCLKI) from TCFBK 504 is also provided to the clocking input of receiver 506, which receives the input data and outputs the received data.

The example embodiments in FIG. 6 have an advantage that it simplifies the clock generation circuits in the master and slave devices as compared to conventional circuits and requires no new circuits. Instead of two clock generation circuits (and two sets of hardware), only one clock generation circuit needs to be used in a master device according to this example embodiment of the invention.

Of course, the example embodiments of the invention are not limited to RDRAM memory systems. Indeed, the embodiments are particularly useful for any one of a wide variety of source synchronous data buses.

Other embodiments may be apparent to those skilled in the art from the detailed description of the exemplary embodiments and claims when read in connection with the accompanying drawings. While the foregoing and following written an illustrated disclosure focuses on disclosing exemplary embodiments of the invention, it should be understood that the same is by way of illustration and example only, is not to be taken by way of limitation and may be modified in learned practice of the invention. While the foregoing has described what are considered to be exemplary embodiments of the invention, it is understood that various modifications may be made therein and that the invention may be implemented in various forms and embodiments, and that it may be applied in numerous applications, only some of which have been described herein. It is intended by the following claims to claim all such modifications and variations.

What is claimed is:

1. A source synchronous data bus comprising:
   a clock generation circuit generating a bus clock signal; and
   a device including a clock generation circuit which generates transmit and receive clock signals for transmitting and receiving data on said bus, said device sending data in quadrature phase relationship with said bus clock signal and receiving data in phase with the bus clock signal.

2. The data bus recited in claim 1, wherein the clock generation circuit comprises a dynamic locked looped (DLL) circuit.

3. The data bus recited in claim 2, wherein the dynamic locked loop (DLL) circuit in the clock generation circuit generates only one clocking signal.

4. The data bus recited in claim 1, wherein the data bus comprises a RDRAM channel.

5. The data bus recited in claim 4, wherein the clock generation circuit is part of a Rambus ASIC Cell (RAC).

6. The data bus recited in claim 3, further comprising a second device, said second device also including a clock generation circuit having a dynamic locked loop (DLL) circuit.

7. The data bus recited in claim 6, wherein said DLL circuit in the clock generation circuit of said second device receives a control signal from a receiver in the clock generation circuit of said second device.

8. The data bus recited in claim 1, wherein said clock generation circuit is implemented as part of a integrated circuit chip.

9. A memory controller comprising:
a bus interface providing a connection between said memory controller and a source synchronous data bus having a bus clock signal; and
a clock generation circuit adapted to generate transmit and receive clock signals for transmitting and receiving data over said data bus, said clock generation circuit sending data over said data bus in quadrature phase relationship with said bus clock signal and receiving data over said data bus in phase with said bus clock signal.

10. The memory controller recited in claim 9, wherein th clock generation circuit has a single dynamic locked loop (DLL) circuit.

11. The memory controller recited in claim 10, wherein the DLL circuit generates only a single clock signal.

12. The memory controller recited in claim 9, wherein the data bus comprises a RDRAM channel.

13. The memory controller recited in claim 12, wherein the clock generation circuit is part of a Rambus ASIC Cell (RAC).

14. A slave device, the device comprising:
a bus interface providing a connection between said slave device and a source synchronous data bus having a bus clock signal; and
a clock generation circuit adapted to generate clock signals for sending and receiving data over said data bus, said clock generation circuit generating a transmit clock signal from a reference clock signal and sending data over said data bus in phase with said bus clock signal.

15. The slave device recited in claim 14, wherein said clock generation circuit includes a dynamic locked loop (DLL) circuit for generating the transmit clock signal.

16. The slave device recited in claim 14, wherein said DLL circuit receives a control signal from a receiver receiving the reference clock signal and a feedback signal generated from an output of the DLL circuit.

17. The slave device recited in claim 16, wherein the slave device comprises a RDRAM memory device.

18. The slave device recited in claim 17, wherein the data bus comprises a RDRAM channel.

* * * * *

UNITED STATES PATENT AND TRADEMARK OFFICE
CERTIFICATE OF CORRECTION

PATENT NO. : 6,832,325 B2
DATED : December 14, 2004
INVENTOR(S) : Liu

It is certified that error appears in the above-identified patent and that said Letters Patent is hereby corrected as shown below:

<u>Title page,</u>
Item [56], References Cited, OTHER PUBLICATIONS,
"Tanaka et al," reference, delete "et al" and insert -- et al, --.

<u>Column 5,</u>
Line 23, delete "th" and insert -- the --.

Signed and Sealed this

Eleventh Day of April, 2006

JON W. DUDAS
*Director of the United States Patent and Trademark Office*